(12) United States Patent
Shibuya

(10) Patent No.: US 6,617,616 B2
(45) Date of Patent: Sep. 9, 2003

(54) CHIP-IN-GLASS FLUORESCENT DISPLAY DEVICE

(75) Inventor: Yoshikazu Shibuya, Chiba (JP)

(73) Assignee: Futaba Corporation, Chiba (JP)

(*) Notice: Subject to any disclaimer, the term of this patent is extended or adjusted under 35 U.S.C. 154(b) by 0 days.

(21) Appl. No.: 10/161,704

(22) Filed: Jun. 5, 2002

(65) Prior Publication Data

US 2002/0185652 A1 Dec. 12, 2002

(30) Foreign Application Priority Data

Jun. 6, 2001 (JP) ........................................ 2001-171478

(51) Int. Cl.⁷ .............................................. H01L 33/00
(52) U.S. Cl. ........................... 257/98; 257/99; 257/100; 313/493; 313/496; 313/340; 313/349; 313/278; 313/257
(58) Field of Search .................... 257/98, 99, 100; 313/493–497, 518, 340, 273, 278, 257, 112, 349

(56) References Cited

U.S. PATENT DOCUMENTS 4,142,126 A * 2/1979 DuBois ...................... 313/497
4,149,105 A * 4/1979 Hirooka et al. ............. 313/496
5,834,892 A * 11/1998 Kikuchi et al. ............. 313/496

FOREIGN PATENT DOCUMENTS

| JP | 58194229 A | * 11/1983 |
| JP | 05205673 A | * 8/1993 |

* cited by examiner

Primary Examiner—Nathan J. Flynn
Assistant Examiner—Remmon R. Fordé
(74) Attorney, Agent, or Firm—Bacon & Thomas, PLLC

(57) ABSTRACT

A fluorescent display device includes an anode plate and a semiconductor device arranged thereon, wherein the anode plate forms a portion of an envelope of the display device and has an anode on an inner surface thereof. The display device further includes a supporting structure and a tensioning member. The supporting structure is disposed on the anode plate and has a top plate portion overlapping the semiconductor device. The tensioning member is disposed on the top plate portion of the supporting structure and serves to arrange a plurality of filament-shaped cathodes at a pitch between the semiconductor device and the top plate portion.

4 Claims, 5 Drawing Sheets

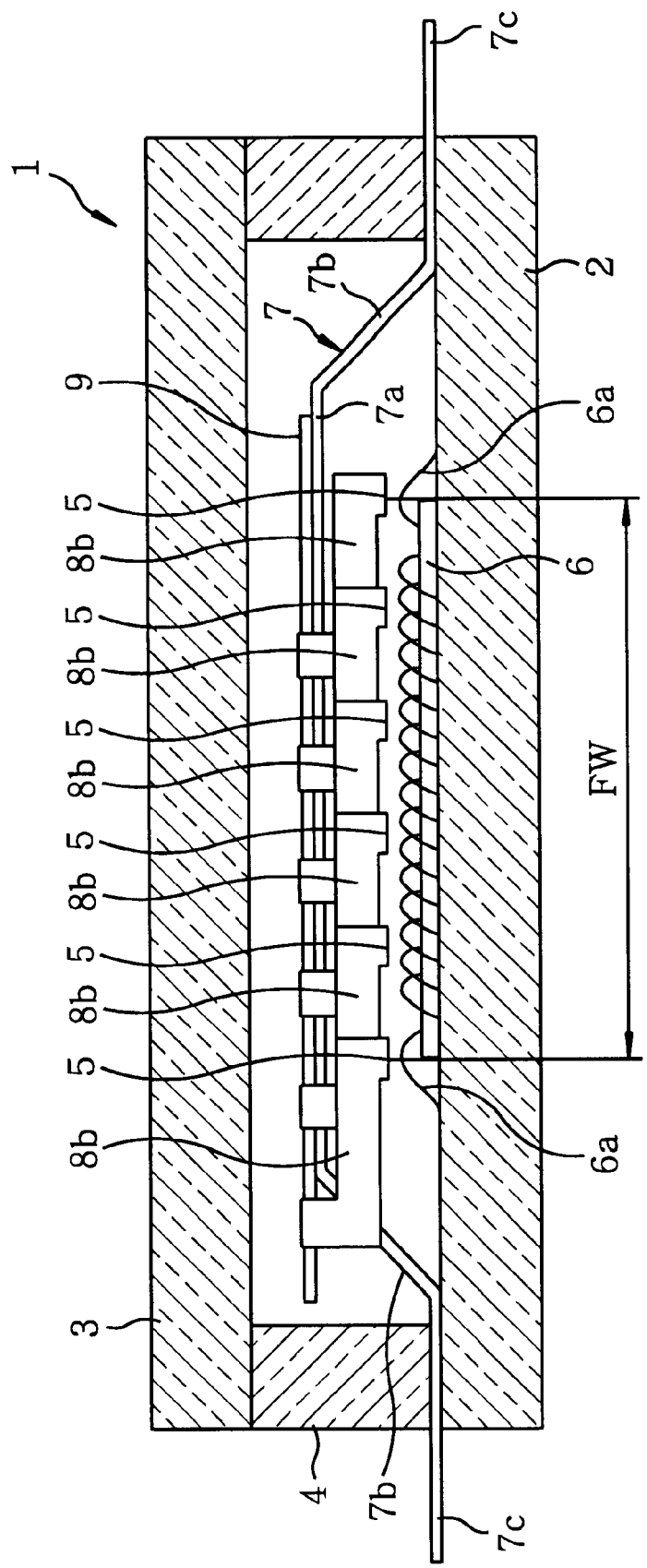

CHIP-IN-GLASS FLUORESCENT DISPLAY DEVICE

FIELD OF THE INVENTION

The present invention relates to a chip-in-glass fluorescent display device having a semiconductor device disposed inside an envelope thereof; and, more particularly, to a semiconductor device built-in fluorescent display device having a semiconductor device arranged in a space under a supporting member of filament-shaped cathodes.

BACKGROUND OF THE INVENTION

Generally, a chip-in-glass fluorescent display device includes a semiconductor device such as an integrated circuit (IC) usually incorporating therein a drive circuit and a control circuit, wherein the semiconductor device is installed inside a highly vacuumed envelope of the display device. Such a chip-in-glass fluorescent display device is advantageous in that a module employing the display device can be small-sized and the circuit thereof rarely needs wirings for an external connection.

However, the semiconductor device installed inside the envelope of the above-mentioned fluorescent display device forms a dead space on a display area (i.e., an area for anodes), thereby reducing the display area. In addition, ultraviolet and visible rays incident from an exterior may cause an erroneous operation of the semiconductor device.

To prevent such problems, a prior art provides a chip-in-glass fluorescent display device shown in FIGS. 1A and 1B. To install a plurality of filament-shaped cathodes 50 (simply referred to as filaments hereinafter) at a certain pitch, an anchor 51 for supporting filaments 50 is fixedly provided on a supporting structure 52. Since a semiconductor device 53 is disposed in a space under the supporting structure 52, the loss of display area due to the installation of the semiconductor device 53 can be avoided and the semiconductor device 53 can be protected from the influence of an external light.

The configuration of the above-explained fluorescent display device is described in more detail. The supporting structure 52 of a metal plate has a top plate portion 52a, side plate portions 52b, and base plate portions 52c. The top plate portion 52a is disposed over the semiconductor device 53. Each of the side plate portions 52b is bent down from a side edge of the top plate portion 52a (in a pitch direction of the filaments 50) and serves to produce an installation space of the semiconductor device 53 under the top plate portion 52a. Each of the base plate portions 52c is bent from a lower portion of a corresponding side plate portion 52b and fixed to an anode plate 54.

The anchor 51 has an anchor base portion 51a and a plurality of arms 51b extended therefrom. The anchor base portion 51a is fixed to an upper surface of the top plate portion 52a of the supporting structure 52, wherein each of the arms 51b has a free end portion for fixing an end portion of a filament 50. The free end portion of each arm 51b is upwardly extended with respect to the anchor base portion 51. The filaments 50 with tension therein are stretched above the supporting structure 52 and the anchor base portion 51a with tension applied to each.

However, the prior art fluorescent display device described above suffers from certain drawbacks. That is, since the filaments 50 are disposed above the supporting structure 52 (and the anchor base portion 51a) covering the semiconductor device 53, a gap is present at a relatively great height "FH" between the filament 50 and the anode plate 54, thereby deteriorating the brightness of the fluorescent display device.

More specifically, in addition to the thickness of the semiconductor device 53 disposed on the anode plate 54, a space is required between the semiconductor device 53 and the supporting structure 52 and, further, the filaments 50 are also vertically spaced apart from the anchor base portion 51a disposed on the supporting structure 52. Therefore, the height "FH" measured from the anode plate 54 to the filament 50 is determined by the above-mentioned thickness and interposed space, wherein a minimum value thereof is usually about 1.3 mm. The relatively great height "FH" of the filaments 50 causes insufficient brightness when the fluorescent display device is used in a car in which a low voltage level, e.g., about 12 V, is applied thereto.

Actually, the height "FH" of the filament 50 needs to be about 0.9 to about 1.10 mm in case such a chip-in-glass fluorescent display device is employed in a car to be operated at a low voltage level. Moreover, some cases may need the height "FH" to be about 1.2 mm even under high voltage driving conditions and, for certain cases, such a conventional fluorescent display device cannot be used at all.

In view of fabricating the supporting structure 52 of the fluorescent display device shown in FIGS. 1A and 1B, it is difficult to bend the side plate portions 52b at a perpendicular angle of 90 degrees with respect to the top plate portion 52a or the base plate portions 52c. Consequently, after the supporting structure 52 is fixed on the anode plate 54, each of the side plate portions 52b is slanted as shown in FIG. 1B, thereby shortening the length of the top plate portion 52a along the pitch direction of the filaments 50. This results in reducing an effective area in the top plate portion 52a for mounting the anchor base portion 51a. As a result, the number of the filaments 50, i.e., a width "FW" of the arranged filaments 50, is limited and, therefore, a display area cannot be enlarged in the pitch direction of the filaments 50.

On the other hand, the anchor 51 serves to apply a tension to the free end portion of each arm 51b in the pitch direction of the filaments 50. Since, however, the area of the top plate portion 52a is small and the number of the arranged filaments 50 is limited, a dead space is formed at an end side along the pitch direction of the filaments 50 (at a right region in FIG. 1B). Therefore, the display area of the conventional fluorescent display device is also decreased in the pitch direction of the filaments 50.

SUMMARY OF THE INVENTION

It is, therefore, an object of the present invention to provide a chip-in-glass fluorescent display device implementing a high brightness and a wide display area in spite of a low voltage driving condition.

In accordance with a preferred embodiment of the present invention, there is provided a fluorescent display device including an anode plate and a semiconductor device arranged thereon, wherein the anode plate forms a portion of an envelope of the display device and has an anode on an inner surface thereof, the display device further including: a supporting structure disposed on the anode plate, the supporting structure having a top plate portion overlapping the semiconductor device; and a tensioning member, disposed on the top plate portion of the supporting structure, for arranging a plurality of filament-shaped cathodes at a pitch between the semiconductor device and the top plate portion.

BRIEF DESCRIPTION OF THE DRAWINGS

The above and other objects and features of the present invention will become apparent from the following description of preferred embodiments given in conjunction with the accompanying drawings, in which:

FIGS. 2A and 2B depict sectional views of a chip-in-glass fluorescent display device in accordance with a preferred embodiment of the present invention.

DETAILED DESCRIPTION OF THE PREFERRED EMBODIMENT

Figure 2B:
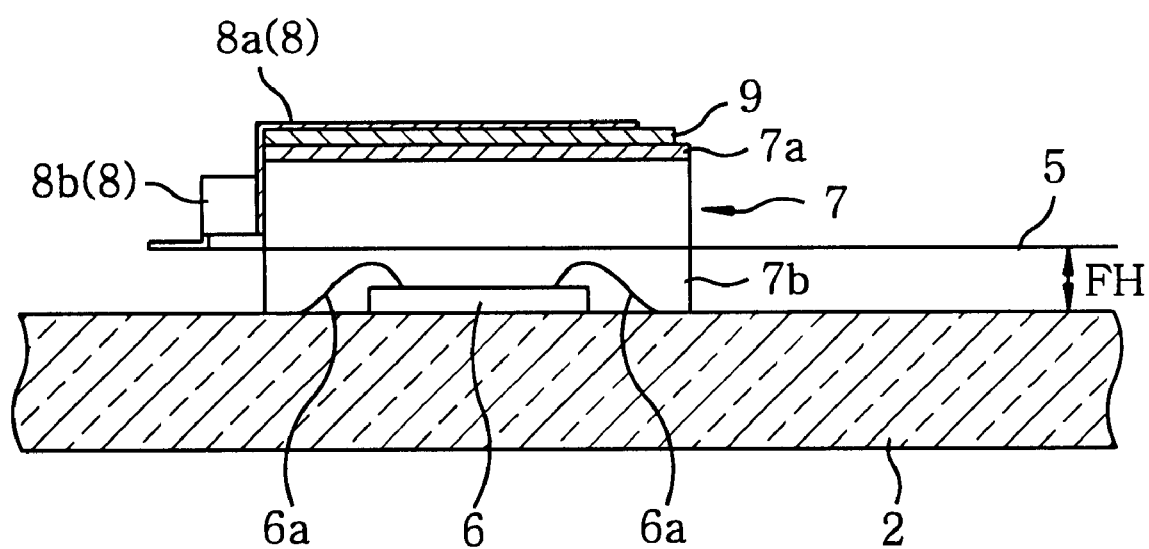
Figure 3:
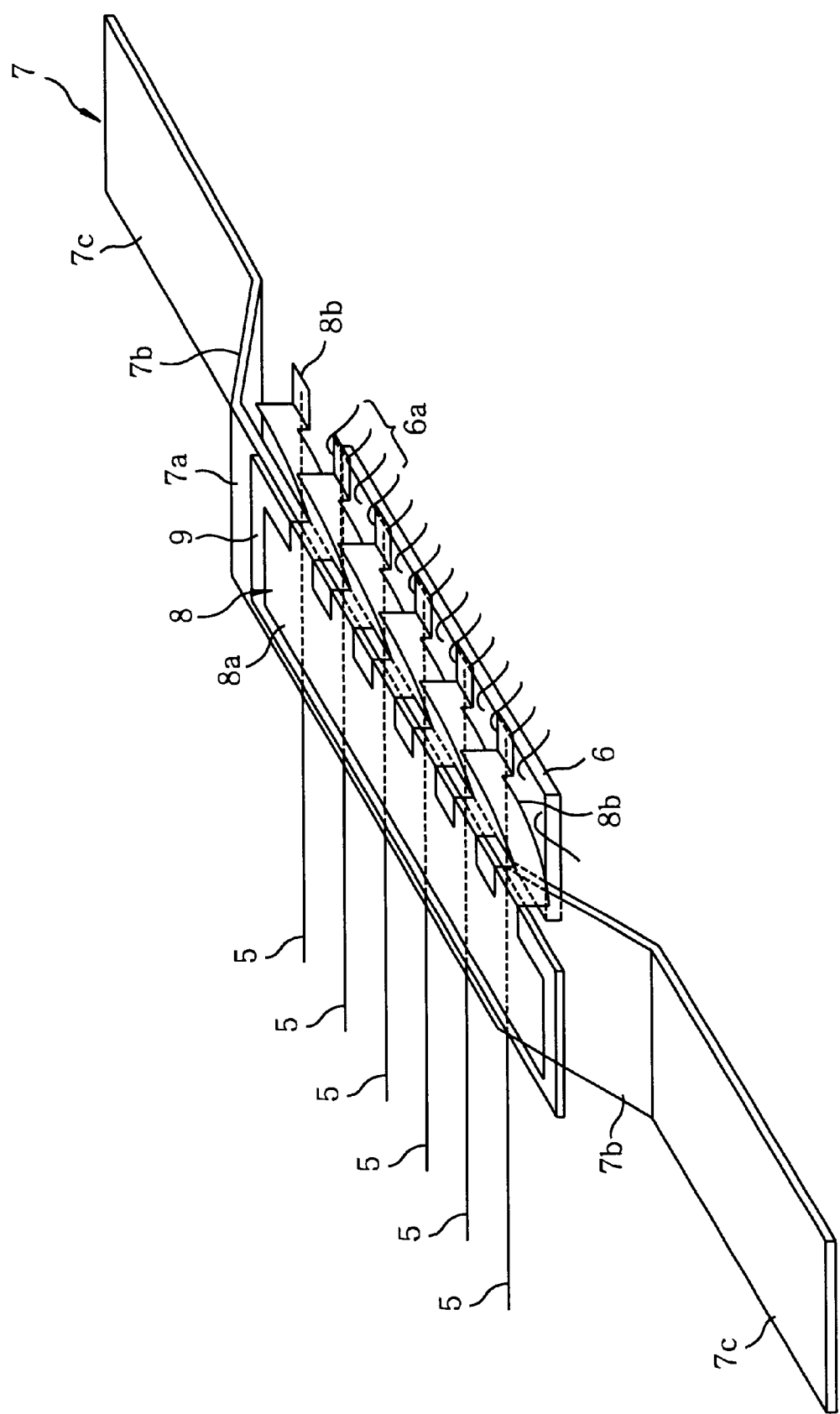
FIG. 3 shows a perspective view of the chip-in-glass fluorescent display device in accordance with the preferred embodiment of the present invention.

Referring now to FIGS. 2A, 2B, and 3, a chip-in-glass fluorescent display device in accordance with a preferred embodiment of the present invention will be described in detail. Like numerals represent like parts in the drawings.

FIGS. 2A and 2B depict sectional views of a chip-in-glass fluorescent display device in accordance with the preferred embodiment of the present invention and FIG. 3 shows a perspective view thereof.

The chip-in-glass fluorescent display device includes a box-shaped envelope 1 having a highly vacuumed inside. The envelope 1 has an anode plate 2, an upper plate 3, and side plates 4, each being made of a glass substrate. The upper plate 3 is spaced apart from the anode plate 2 with a certain gap interposed therebetween. Each of the side plates 4 is hermetically sealed along side edges of the upper plate 3 and the anode plate 2 by applying a sealant therebetween.

Disposed on an inner surface of the anode plate 2 inside the envelope 1 is an anode (not shown) of a patterned shape, having a positive conductor and a fluorescent material bonded thereto. Further, a control electrode (not shown) is formed to cover an upper portion of the anode and a plurality of filaments 5 for emitting electrons are formed at a certain pitch to face the anode at a height "FH".

The filament 5 is formed by bonding a core and an electron-emitting material, such as an alkaline-earth metal carbonate, wherein the core is made of tungsten and has a diameter of several to scores of micrometers ($\mu$m). The alkaline-earth metal carbonate may be a ternary carbonate formed by mixing $BaCO_3$, $SrCO_3$, and $CaCO_3$ at a certain mixing ratio.

Arranged on the anode plate 2 inside the envelope 1 is a semiconductor device 6 formed of an IC. The semiconductor device 6 serves to drive electrodes such as the positive electrode or a negative electrode and is electrically connected to a terminal (not shown) of the anode plate 2 via a bonding wire 6a. The thickness of the semiconductor device 6 is about 0.3 to about 0.35 mm and, if the bonding wire 6a is added thereto, the total thickness thereof becomes about 0.55 mm.

The semiconductor device 6 is disposed in the space under the supporting structure 7. The supporting structure 7 is made of a metallic plate and includes a top plate portion 7a, side plate portions 7b, and base plate portions 7c. The top plate portion 7a overlaps the semiconductor device 6. Each of the side plate portions 7b is bent from a side edge of the top plate portion 7a and serves to produce a space between the top plate portion 7a and the semiconductor device 6. Each of the base plate 7c is bent from a lower edge of a corresponding side plate portion 7b in an opposite direction of the top plate portion 7a, so that the supporting structure 7 is of a substantially convex shape. The supporting structure 7 is arranged on the anode plate 2, wherein each base plate portion 7c thereof is fixed between the anode plate 2 and a corresponding side plate 4 by applying a sealant therebetween. Preferably, the supporting structure 7 is made of alloy 426 presenting a heat expansion coefficient similar to that of the sealant.

The above-mentioned semiconductor device 6 and the supporting structure 7 are fixed on an anchor 8 that serves as a tensioning member for supporting and tensioning the filaments 5. The anchor 8 is fixed to the supporting structure 7 and formed of a thin metal plate made of, e.g., stainless steel (SUS304). Further, the anchor 8 includes an anchor base portion 8a of a plate shape and a plurality of arms 8b extended therefrom. The anchor base portion 8a is fixed on an upper surface of the top plate portion 7a of the supporting structure 7 by using a spot welding. Each arm 8b of the anchor 8 serves to fix an end portion of a corresponding filament 5 at a free end portion thereof.

The free end portion of the arm 8b is downwardly bent and extended from the anchor base portion 8a so as to match to a height of the space between the supporting structure 7 (or the top plate portion 7a) and the semiconductor device 6. Further, the arms 8b are arranged along a pitch direction of the filaments 5 (from left to right in FIG. 2A) and implement elasticity along the length of the filaments 5.

Not shown in the drawings, an opposite end portion of the filament 5 is also fixed by a support serving as another tensioning member, which is fixed to the top plate portion 7a of the supporting structure 7 overlapping the semiconductor device 6. A couple of the support and a corresponding anchor 8 serve to support the filament 5 with the tension applied thereto. The support includes a support base portion of the same plate shape as the anchor base portion 8a and a fixing portion, which is of a plate segment shape bent from the support base portion to fix the opposite end portion of the filament 5. On the contrary to the arm 8b, the fixing portion rarely has elasticity so as to safely fix the opposite end portion of the filament 5.

Like the anchor 8, the support can be fixed via another supporting structure 7 regardless whether the semiconductor device 6 is present or not. If the semiconductor device 6 is not present at the anchor side, the support adopts the same configuration of the anchor 8 shown in FIGS. 2A, 2B, and 3. That is to say, the anchor 8 and the support may exchange their positions, depending on where the semiconductor device 6 is present. Further, the support may be fixed to the anode plate 2 via a conventional supporting structure instead of the supporting structure 7 shown in FIGS. 2A, 2B, and 3. In that case, the filaments 5 are also constructed parallel with the tension applied thereto.

Each of the filaments 5, fixed by the tensioning members at both end portions thereof, maintains parallel to the others. Further, at the constant height "FH" measured from the anode, the filaments 5 pass through the space interposed between the semiconductor 6 and the top plate portion 7a. The filaments 5 are formed over the anode plate 2 at a certain pitch with the tension applied thereto.

Though the filaments 5 shown in FIGS. 2A, 2B, and 3 are arranged within a width "FW" inside the space interposed between the semiconductor device 6 and the top plate portion 7a, the filaments 5 may be extended along an outside of the side plate portions 7b so long as they are located in the space between the semiconductor device 6 and the top plate portion 7a.

As previously described, each of the filaments 5 is arranged between the semiconductor device 6 and the top plate portion 7a, at the height "FH" measured from the anode. The conventional configuration shows that an anode, a semiconductor device, a space, a supporting structure, filaments are sequentially arranged, so that a minimum height of the filament is 1.3 mm. Compared to the prior art, the inventive configuration shows that the anode, the semiconductor device, the space, the filaments are sequentially arranged, so that each filament 5 has a lower height of about 0.9 to about 1.1 mm, to thereby put it closer to the anode. As a result, the fluorescent display device in accordance with the preferred embodiment can implement a sufficient brightness in spite of being employed in a car in which a low voltage level (usually 12V) is applied thereto.

The chip-in-glass fluorescent display device in accordance with the preferred embodiment of the present invention has another feature. As shown in FIGS. 2A, 2B, and 3, a middle member 9 is formed between the top plate portion 7a of the supporting structure 7 and the anchor base portion 8a of the anchor 8 (or the support base portion of the support). The middle member 9 is made of a metal plate having enough rigidity to support the anchor base portion 8a (or the support base portion) and is more extended in the pitch direction of the filaments 5 than the top plate portion 7a of the supporting structure 7 is.

The middle member 9 is fixed on an upper surface of the top plate portion 7a by means of a spot welding while the anchor base portion 8a (the support base portion) is fixed on the middle member 9 by means of the same. Unlike this, the middle member 9 together with the anchor base portion 8a (the support base portion) may be spot-welded to the upper surface of the top plate portion 7a. The material of the middle member 9, though not limited, is preferably the same as that of the supporting structure 7 (e.g., alloy 426 having the same heat expansion coefficient as that of the sealant).

As previously described, the anchor 8 (or the support) is fixed to the middle member 9, which is more extended in the pitch direction of the filaments 5 than the top plate portion 7a of the supporting structure 7 is. This configuration makes it possible to increase the number of filaments 5 by elongating the anchor base portion 8a (the support base portion) in the pitch direction over the top plate portion 7a and simultaneously increasing the number of arms 8b (the fixing member). As a result, the filaments 5 can be arranged over an increased width "FW" and an inner space of the envelope 1 can be effectively used to increase the display area (the area of the anode).

Figure 1A:
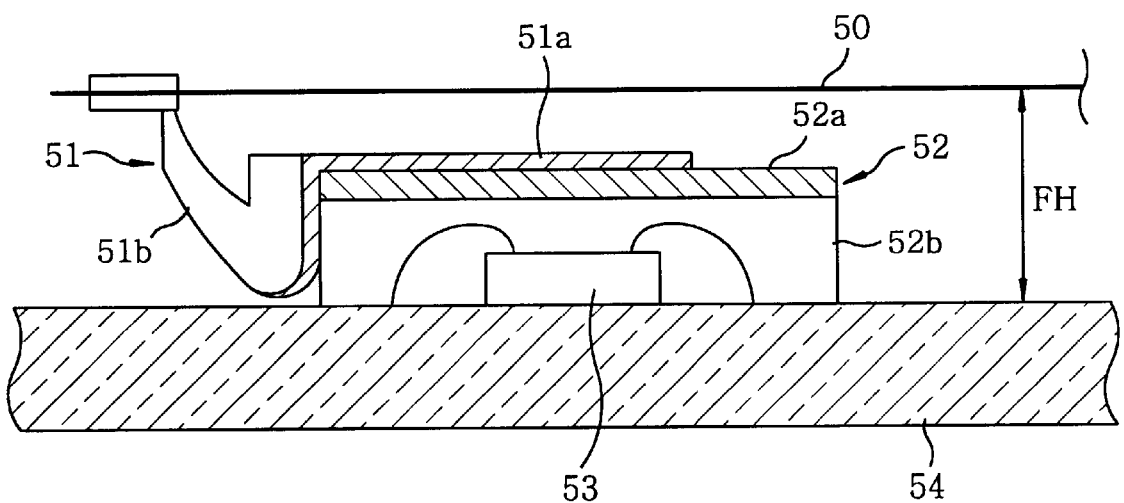
FIGS. 1A and 1B provide sectional views of a chip-in-glass fluorescent display device according to the prior art.
Figure 1B:
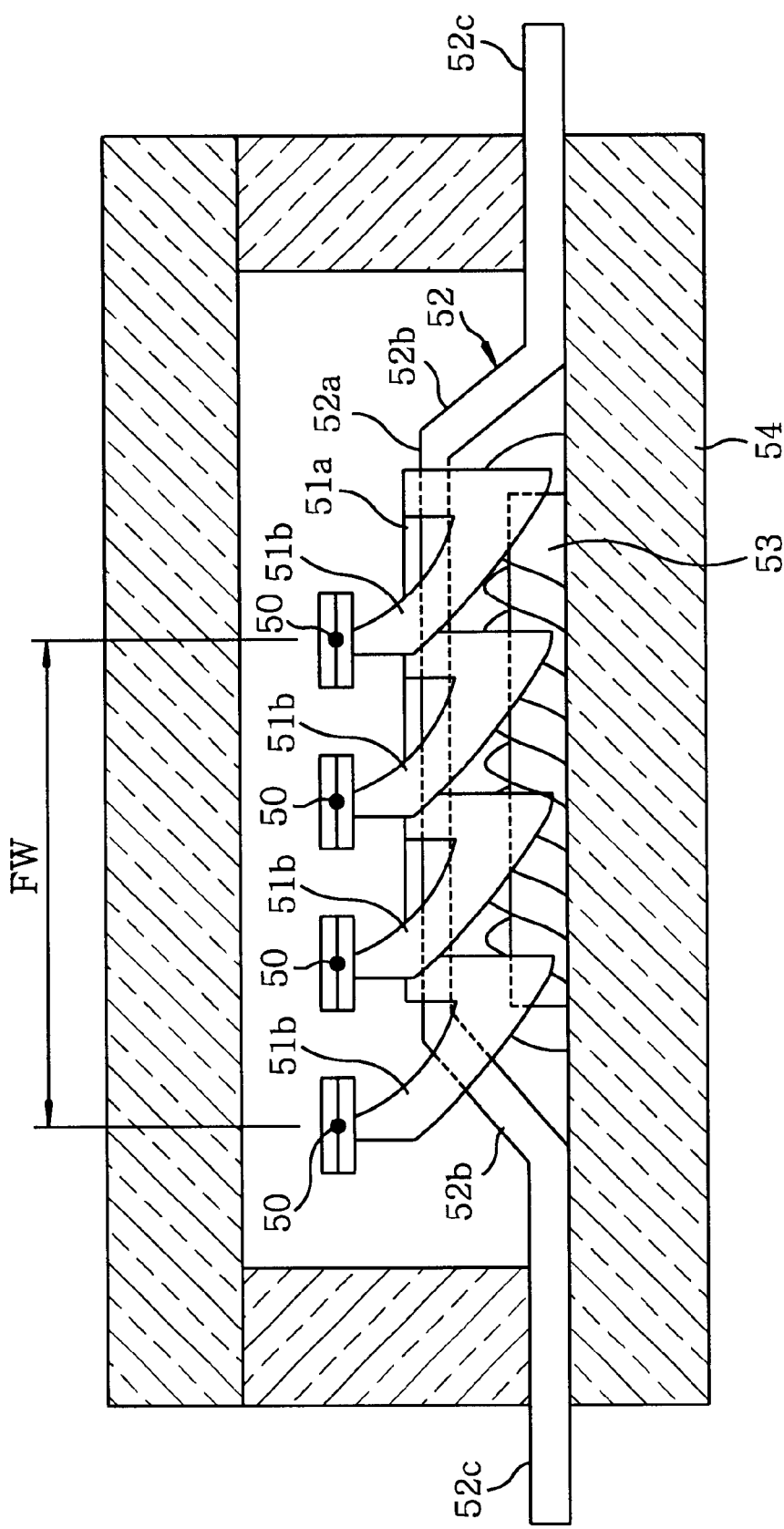

On the other hand, the middle member 9 makes it possible to selectively adjust the position of the filaments 5 along the pitch direction thereof. Since the arm 8b is extended toward a first side in the pitch direction of the filaments 5 (i.e., toward a right region in FIG. 1A) to present the elasticity along the length of the filaments 5, a dead space may be formed at a second side in the pitch direction thereof (i.e., a left region in FIG. 1A) unless the positions of the filaments 5 are properly adjusted. In the inventive fluorescent display device, however, by moving the middle member 9 toward the second side in the pitch direction of the filaments 5, the positions of the filaments 5 can be properly adjusted along the pitch direction thereof. Consequently, the display area (the area of the anode) can be enlarged along the pitch direction of the filaments 5 without the above-mentioned dead space.

In the conventional fluorescent display device, a plate-shaped supporting structure for supporting tensioning members (i.e., the anchor 8 and the support) are extended to an outside of an envelope and fixed between an anode plate and side plates by applying a sealant. Herein, alloy 426, presenting a similar heat expansion coefficient to that of the sealant, is selected for the supporting structure to prevent a crack that may result from a difference in heat expansion coefficients between a sealed portion and the sealant. Compared to that, because a spring steel, such as SUS304 and SUS 631, is usually selected for the tensioning members mounted on the supporting structure, the tensioning members are conventionally spaced as far as possible apart from the sealant. This conventional configuration causes a dead space formed between the tensioning member and a side portion of the envelope, thereby limiting the display area (the area of the anode).

In case of the chip-in-glass fluorescent display device in accordance with the preferred embodiment, however, the tensioning members are spaced far apart from the sealant by the supporting structure 7 but can be arranged near the side plates 4 by the middle member 9. Consequently, the number of the filaments 5 arranged in tension is increased due to an increase in width "FW" in the pitch direction of filaments 5, so that the display area becomes larger than that of the conventional fluorescent display device.

In the above-described chip-in-glass fluorescent display device in accordance with the preferred embodiment of the present invention, the tensioning member serves to arrange a plurality of filament-shaped cathodes at a certain pitch between the semiconductor device and the top plate portion. The tensioning member is fixed on the upper surface of the top plate portion of the supporting structure, fixed on the anode plate while overlapping the semiconductor device. By this configuration, the filament-shaped cathode can be arranged at a low height enough to pass through the space between the semiconductor device and the top plate portion. As a result, a sufficient brightness can be obtained even under a low voltage driving condition.

Further, the plate-shaped middle member is more extended in the pitch direction of the filament-shaped cathodes than the top plate portion of the supporting structure is. The middle member is fixed on the upper surface of the top plate portion while the tensioning member is fixed on the middle member. By this configuration, the number of the filament-shaped cathodes arranged is increased, so that an enlarged display area (the area of the anode) can be obtained.

The tensioning member includes the plate-shaped anchor base portion, fixed on the top plate portion of the supporting structure, and the arm downwardly bent from the anchor base portion. The arm serves to fix an end portion of the filament-shaped cathode at its elastic free end portion extended toward the first side of the pitch direction of the filament-shaped cathode. In case of employing the middle member together with the above-described tensioning member, if the middle member is moved toward the second side of the pitch direction of the filament-shaped cathodes before being fixed on the supporting structure, a dead space can be removed for obtaining an enlarged display area (the area of the anode) along the pitch direction thereof.

Furthermore, the tensioning member is spaced far apart from the sealant by the supporting structure but arranged near the side plates 4 by the middle member, so that the number of the filaments arranged under tension can be increased over an increased width to thereby enlarge the display area (the area of the anode).

While the invention has been shown and described with respect to the preferred embodiment, it will be understood to those skilled in the art that various changes and modifications may be made without departing from the spirit and scope of the invention as defined in the following claims.

What is claimed is:

1. A fluorescent display device including an anode plate and a semiconductor device arranged thereon, wherein the anode plate forms a portion of an envelope of the display device and has an anode on an inner surface thereof, the display device comprising:

a supporting structure disposed on the anode plate, the supporting structure having a top plate portion overlapping the semiconductor device; and a tensioning member, disposed on the top plate portion of the supporting structure, for arranging a plurality of filament-shaped cathodes at a pitch between the semiconductor device and the top plate portion.

2. The display device of claim 1, wherein the tensioning member includes an anchor base of a plate shape and a plurality of arms bent in a downward direction from the anchor base, the anchor base being fixed on the top plate portion of the supporting structure, each arm having an elastic free end portion extended along a pitch direction of the filament-shaped cathodes, wherein the free end portion serves to fix an end portion of the filament-shaped cathode with tension applied thereto.

3. The display device of claim 2, further comprising:

a middle member of a plate shape more extended along the pitch direction of the filament-shape cathodes than the top plate portion of the supporting structure, wherein the middle member is fixed on an upper surface of the top plate portion while the tensioning member is fixed on the middle member.

4. The display device of claim 1, further comprising:

a middle member of a plate shape more extended along the pitch direction of the filament-shape cathodes than the top plate portion of the supporting structure, wherein the middle member is fixed on an upper surface of the top plate portion while the tensioning member is fixed on the middle member.

* * * * *